United States Patent
Jacobson et al.

(10) Patent No.: US 8,343,716 B2
(45) Date of Patent: Jan. 1, 2013

(54) METHOD OF FORMING VARIABLE PATTERNS USING A RETICLE

(75) Inventors: Lee J. Jacobson, Cape Elizabeth, ME (US); Francis J. McNally, Melrose, MA (US); Zualfquar Mohammed, Salem, NH (US); Robert Maher, Newton, MA (US)

(73) Assignee: Analog Devices, Inc., Norwood, MA (US)

( * ) Notice: Subject to any disclaimer, the term of this patent is extended or adjusted under 35 U.S.C. 154(b) by 1029 days.

(21) Appl. No.: 12/253,025

(22) Filed: Oct. 16, 2008

(65) Prior Publication Data

US 2009/0098487 A1   Apr. 16, 2009

Related U.S. Application Data

(60) Provisional application No. 60/980,308, filed on Oct. 16, 2007.

(51) Int. Cl.
*G03C 5/04* (2006.01)

(52) U.S. Cl. .................. 430/394; 430/397; 430/312

(58) Field of Classification Search .................. 430/312, 430/394, 397
See application file for complete search history.

(56) References Cited

U.S. PATENT DOCUMENTS

| | | | |
|---|---|---|---|
| 5,437,946 A * | 8/1995 | McCoy | 430/5 |
| 2007/0146669 A1* | 6/2007 | Butler | 355/55 |
| 2007/0218627 A1* | 9/2007 | Lattard et al. | 438/253 |

* cited by examiner

*Primary Examiner* — Daborah Chacko Davis
(74) *Attorney, Agent, or Firm* — Sunstein Kann Murphy & Timbers LLP

(57) ABSTRACT

A method of forming a variable pattern across a wafer using a reticle forms a plurality of first patterns on the wafer. The first pattern is repeated across the wafer and each first pattern has a first readable element. The method also forms a plurality of second patterns on the wafer. The second patterns is repeated across the wafer and each second pattern has a second readable element. The second patterns are positioned relative to the first patterns by aligning a first second pattern relative to one portion of a corresponding first pattern and then incrementally misaligning each successive second pattern in a row or a column relative to its corresponding first pattern. Thus, each corresponding first readable element and second readable element form a corresponding variable pattern.

20 Claims, 16 Drawing Sheets

METHOD OF FORMING VARIABLE PATTERNS USING A RETICLE

CROSS-REFERENCE TO RELATED APPLICATIONS

This patent application claims priority to U.S. Provisional Patent Application No. 60/980,308 filed Oct. 16, 2007, entitled INTEGRATED CIRCUIT WITH RETICLE INDICIA, the disclosure of which is incorporated by reference herein in its entirety.

FIELD OF THE INVENTION

The invention generally relates to wafer fabrication processes and, more particularly, the invention relates to using a reticle to form variable patterns across a wafer.

BACKGROUND OF THE INVENTION

Semiconductor wafers are typically processed by a sequence of thin film depositions and etches performed on the wafer or substrate. Various thin film layers may be patterned using photolithography techniques. Many modern photolithographic tools use a "step and repeat" exposure method in which a reticle forms identical patterns across the wafer in certain layers. In this process, each exposed layer has patterns that are aligned to the patterns below within tight tolerances. Each processed wafer typically includes an array of identical dies that that are subsequently diced up into individual dies. Each die may include circuitry and/or structures, e.g., MEMS structures, which may be used in devices.

Typically, semiconductor technology relies on die to die uniformity and high precision alignment between layers across the wafer. For example, process variations across the wafer or from layer to layer may sometimes adversely affect the functionality or performance of the individual dies. Thus, die level traceability is a highly sought after function by many semiconductor companies. Die level traceability allows one to identify the exact die location within a wafer from which the diced product was manufactured. For a number of reasons, it is often very useful for a manufacturer to know that exact location. For example, this information may be useful in identifying manufacturing issues and to help enhance yield, quality, and reliability. In addition, this information may enable further analysis, such as relating which processes and machinery formed particular dies that have been returned due to a malfunction. With this information, the manufacturer may be able to more readily and rapidly pinpoint and rectify manufacturing problems, enhance yield, and drive manufacturing and quality improvements.

To address die level traceability, some in the art use expensive test, trim, and process enhancements to identify each die location on the wafer. For example, many schemes have been developed including laser marking of scratch pads, fuse blowing at probe, programming non-volatile memory (NVM) on appropriate technologies, catalog identification using natural variation electrical signatures. All of these technologies have advantages and disadvantages in cost, process complexity, and process compatibility.

SUMMARY OF THE INVENTION

In accordance with one embodiment of the invention, a method of forming a variable pattern across a wafer using a reticle forms a plurality of first patterns on the wafer. The first pattern repeats across the wafer and each first pattern has a first readable element. The method also forms a plurality of second patterns on the wafer. The second pattern repeats across the wafer and each second pattern has a second readable element. The second patterns are positioned relative to the first patterns by aligning a first second pattern relative to one portion of a corresponding first pattern, and then incrementally misaligning each successive second pattern in a row or a column relative to its corresponding first pattern. Together, each corresponding first readable element and second readable element form the variable pattern.

In accordance with related embodiments, the first pattern and the second pattern may be formed by two different reticles. The first pattern and the second pattern may be formed by two patterns on one reticle. Each first pattern may have a length, and incrementally misaligning each successive second pattern may include moving the wafer a distance greater than or less than the length of the first pattern. Each first pattern may have a width, and incrementally misaligning each successive second pattern may include moving the wafer a distance greater than or less than the width of the first pattern. Each first pattern may have an area and each second pattern may have a larger or smaller area than the first pattern, so that incrementally misaligning each successive second pattern includes forming the larger or smaller area. The variable pattern may be optically and/or electrically readable. The variable pattern may form one or more electrical components and/or one or more patterns that indicate the physical location of die within the first pattern and die in the wafer.

In accordance with another embodiment of the invention, a method of patterning a wafer applies a first reticle image to the wafer repeatedly in order to form a first repeating pattern. Each first pattern has a first readable element. The method also applies a second reticle image to the wafer repeatedly in order to form a second repeating pattern. Each second pattern has a second readable element. The second repeating pattern may be aligned with respect to a portion of one first repeating pattern. Then, the second repeating pattern may be offset from subsequent first repeating patterns by a distance that varies across the wafer. Thus, the first readable element and the second readable element form a variable pattern that varies across the wafer.

In accordance with related embodiments, the first reticle image and the second reticle image may be formed from one reticle. Alternatively, the first reticle image and the second reticle image may be formed from two different reticles. The variable pattern may form one or more electrical components, which may include one or more of resistors, capacitors, diodes, or read-only memory. Applying a second reticle image may include varying dimensions of the second reticle image relative to the first reticle image. The method may further move the wafer a dimension greater than or less than one dimension of the first repeating pattern in order to offset the subsequent first repeating patterns by the varying distance.

BRIEF DESCRIPTION OF THE DRAWINGS

The foregoing features of the invention will be more readily understood by reference to the following detailed description, taken with reference to the accompanying drawings, in which.

DESCRIPTION OF ILLUSTRATIVE EMBODIMENTS

Various embodiments of the present invention relate to methods of varying features across a wafer using photolithography techniques. The methods may be used to identify die locations on the wafer. The methods may also be used to allow various dies on the wafer to have unique circuit elements and connections. The unique circuitry and/or patterns may have optically and/or electrically readable elements created in each reticle field or die on the wafer. This is accomplished through the use of carefully engineered mismatch in pattern placement and/or stepping distance at one or more photolithographic steps, and a carefully engineered layout and design interaction with the pattern placement mismatches. Details of illustrative embodiments are discussed below.

Although the following discussion describes various relevant steps of forming a variable pattern across a wafer, it does not describe all the required steps. Other processing steps may also be performed before, during, and/or after the discussed steps. Such steps, if performed, have been omitted for simplicity. The order of the processing steps may also be varied and/or combined. Accordingly, some steps are not described and shown. Similarly, although the following discussion involves specific structures or device configurations, principles of illustrative embodiments may apply to other configurations and processes. Accordingly, discussion of structures and/or configurations is exemplary and is not intended to limit the scope of various embodiments of the invention.

Figure 1:
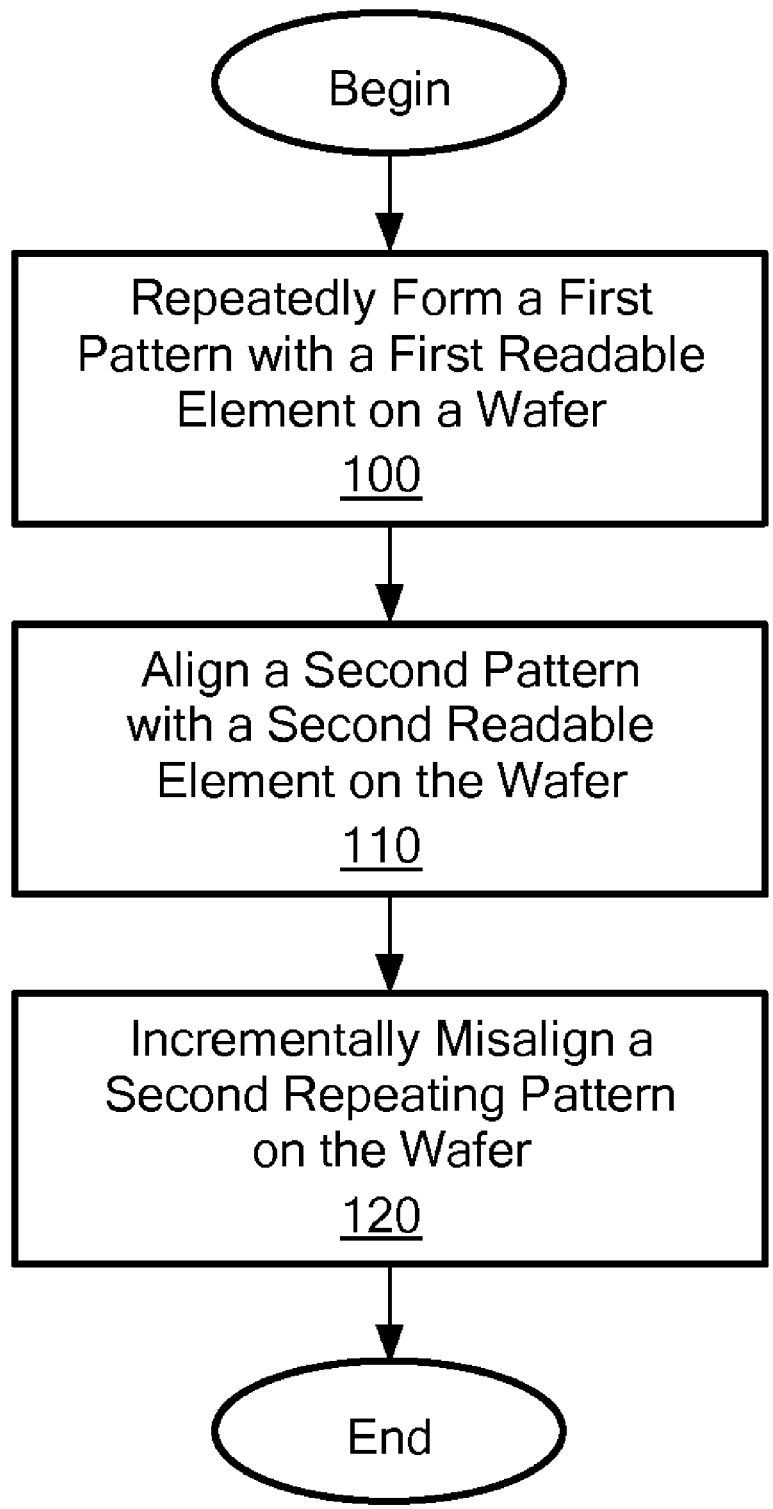
FIG. 1 shows a process of forming a variable pattern across a wafer using a reticle according to illustrative embodiments of the present invention.
Figure 2:
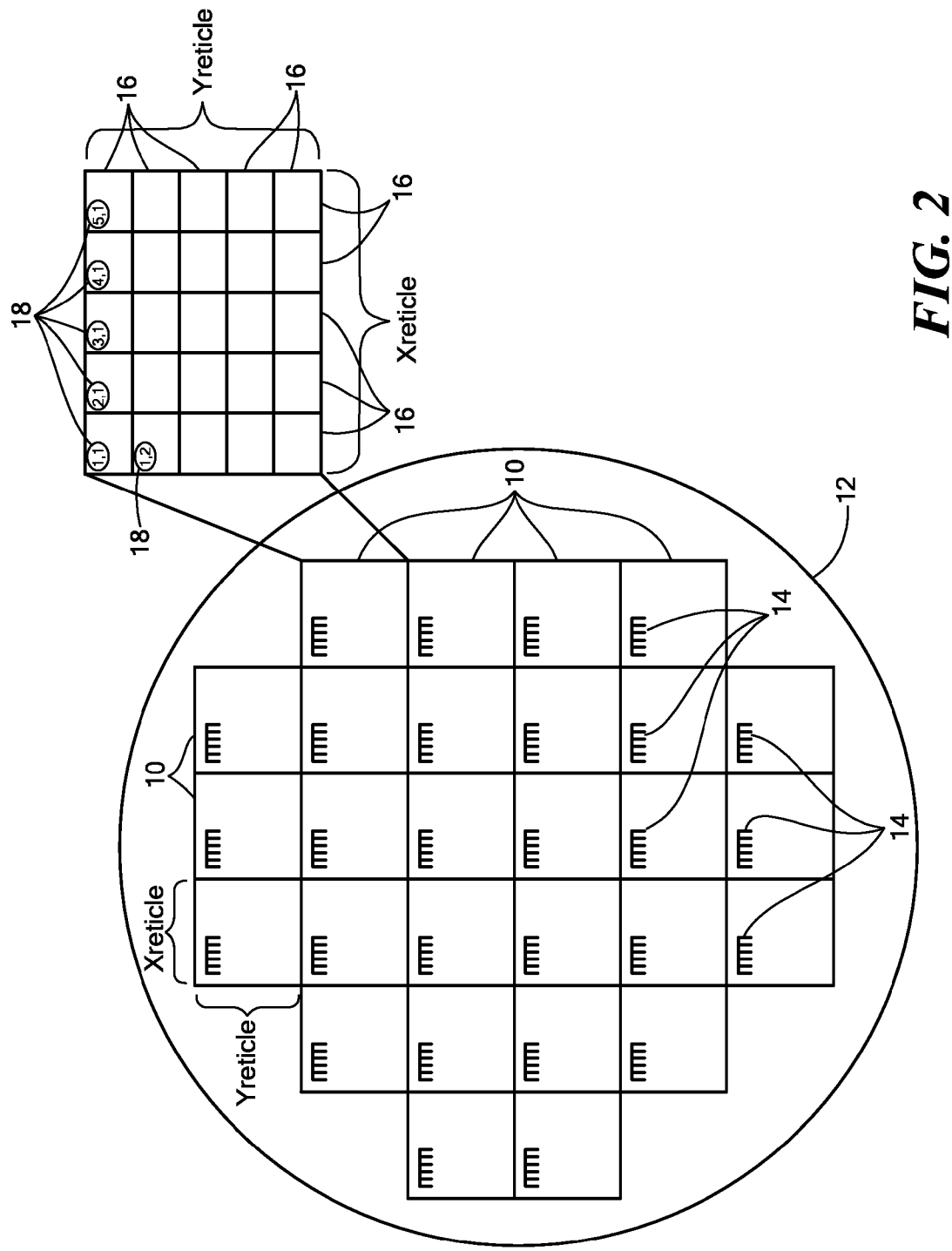
FIG. 2 schematically shows a wafer with a first repeating pattern according to illustrative embodiments of the present invention.

FIG. 1 shows a process of forming a variable pattern across a wafer using a reticle according to illustrative embodiments of the present invention. The process begins at step 100, in which a first pattern 10 is repeatedly formed on a wafer 12, such as shown in FIG. 2. The wafer 12 may be formed from known materials, e.g., a silicon wafer or an SOI wafer. As known by those in the art, one or more layers may be formed on the surface of the wafer 12. The layers may include one or more layers of materials typically used in the manufacture of a semiconductor or MEMS device, such as an oxide layer, photoresist layer, a polysilicon layer, a nitride layer, conductive metal layer, etc. The various layers may be masked off or patterned using processes well known to those skilled in the art, e.g., using photolithography and etching techniques.

The first pattern 10 is formed in one layer of the wafer with a reticle (not shown) having a reticle field or exposure area, e.g., designated Xreticle for the horizontal dimension and Yreticle for the vertical dimension in FIG. 2. As known by those skilled in the art, during wafer processing, the reticle typically exposes one area (e.g., Xreticle×Yreticle image) and then the wafer 12 is moved over or stepped the distance of the reticle field in one dimension (e.g., either Xreticle in the horizontal direction or Yreticle in the vertical direction), and then the reticle exposes the next area. This processes is typically repeated across the entire wafer surface in both the horizontal and vertical directions, forming an array of first patterns 10 or prime die.

Each first pattern 10 includes a first readable element 14 which is carefully designed to interact with a second readable element (e.g., as shown in FIGS. 3A-3F), which will be discussed in more detail below. Each first pattern 10 may include a two dimensional array of individual dies 16, such as shown in the expanded view of one first pattern 10 in FIG. 2. In this example, FIG. 2 shows a 5×5 array of individual dies 16, although other configurations may be used. The individual dies 16 may include readable elements 18 which may identify the individual die's intra-die position within the first pattern 10. For example, as shown, the identification may include 1,1 for the first column, first row, 2,1 for the second column, first row, etc., or may include other identification as is well known to those skilled in the art. The individual dies 16 may also include patterns that, with conventional fabrication processes, may form structure (e.g., MEMS microstructure) and/or circuitry (e.g., transistors) on or within the die.

Figure 3A:
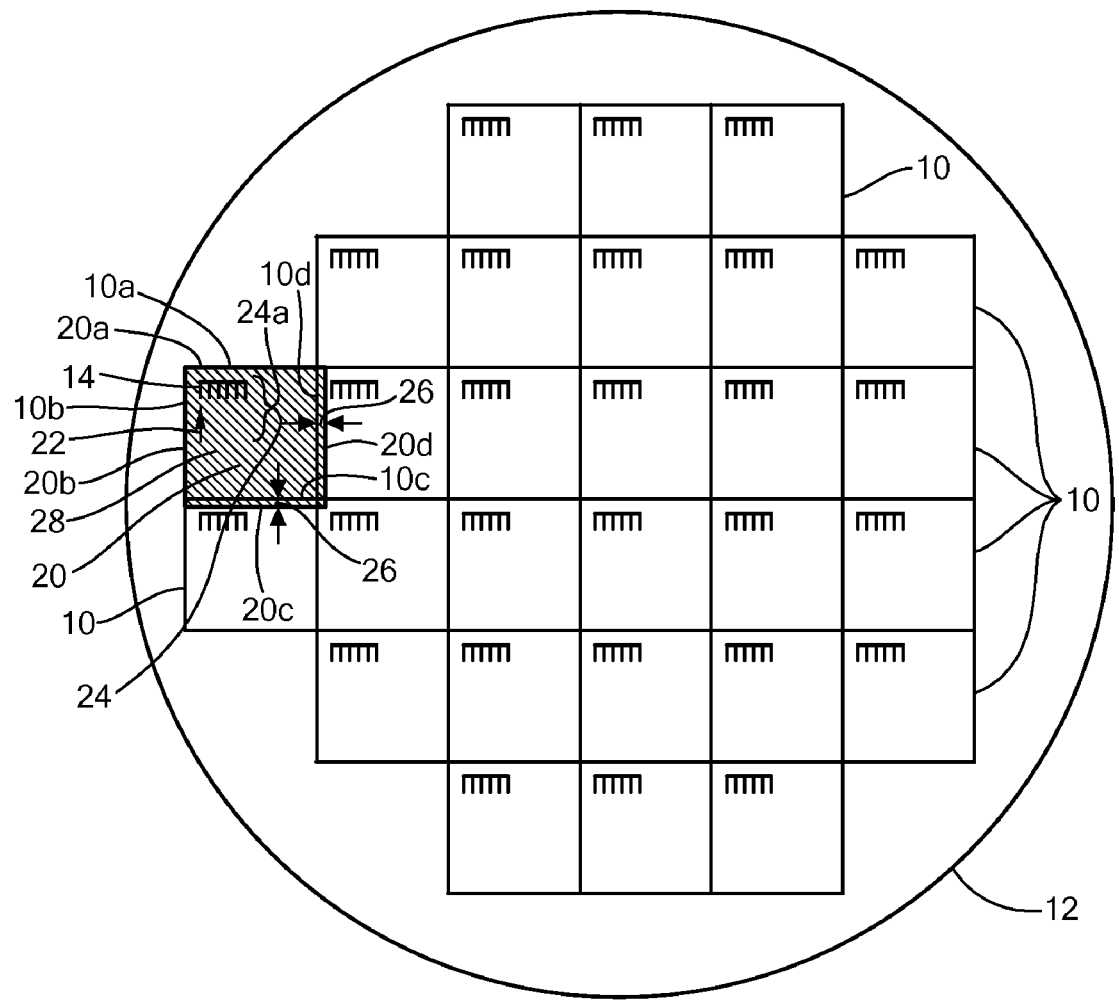
FIGS. 3A-3F schematically show the progression of a second repeating pattern varying across the wafer in a row relative to the first repeating pattern according to illustrative embodiments of the present invention.

Referring again to FIG. 1, in step 110, a second pattern 20 (shown as a shaded grey area in FIG. 3A) is formed on the wafer 12. The second pattern 20 is substantially aligned with a portion of the first pattern 10. For example, as shown in FIG. 3A, upper edge 20a of second pattern 20 (from the perspective of the drawing) is substantially aligned with the upper edge 10a of first pattern 10 and left side edge 20b of second pattern 20 is substantially aligned with the left side edge 10b of first pattern 10. However, the second pattern 20 may not be aligned with a portion of the first pattern 10. For example, as shown in FIG. 3A, lower edge 20c of second pattern 20 is not aligned with the lower edge 10c of first pattern 10 and right side edge 20d of second pattern 20 is not aligned with the right side edge 10d of first pattern 10. Thus, the second pattern 20 may be offset from the first pattern 10 by an increment 26 in the horizontal direction, in the vertical direction, or both, such as shown in FIG. 3A. If an offset is used in both the horizontal and vertical directions, the increment 26 may be the same distance or a different distance. For example, if the first pattern 10 was a square shape (e.g., 100 μm×100 μm), and the second pattern 20 had a larger area (e.g., 110 μm×110 μm), then the second pattern would be misaligned on the one side by an increment of 10 μm.

The second pattern 20 may be formed using a second reticle (not shown), or the second pattern 20 may be formed using the same reticle that was used to form the first pattern 10. In this case, the reticle may have one pattern for forming the first pattern 10 and another pattern on another area of the reticle for forming the second pattern 20. One or more reticles used in embodiments of the present invention may be made of known materials, e.g., chrome on quartz, and formed with known methods, e.g., e-beam lithography.

The second pattern 20 includes a second readable element 22 that together with the first readable element 14 on the corresponding first pattern 10 forms a variable pattern 24. For example, in FIG. 3A, the variable pattern 24a is an arrow (the second readable element 22) pointing to the first of six hatch marks (the first readable element 14). The variable pattern 24 may be used to form circuitry and/or patterns that may include optically and/or electrically readable information. For example, the information may identify prime die locations on the wafer. In FIG. 3A, for example, the variable pattern 24a designates that the prime die 28 is the first, leftmost die in a row of six prime die.

Referring again to FIG. 1, in step 120, another second pattern 20 (shown as a darker shaded grey area in FIG. 3B) is formed on the wafer 12. The left edge of this second pattern 20 (darker shaded grey area) is substantially aligned with respect to the right edge of the first second pattern 20 (lighter shaded grey area). However, the second pattern 20 is misaligned with respect to the underlying, corresponding first pattern 10 by the increment 26. For example, if the second reticle field forms a second pattern 20 with an area (e.g., 110 μm×110 μm), then the next, subsequent second pattern 20 may be formed by moving or stepping the wafer 12 over the distance of the second reticle field in one dimension, e.g., 110 μm. Each subsequent second pattern 20 is then moved this same distance, e.g., 110 μm, incrementally misaligning the second pattern 20 with respect to its corresponding first pattern 10. For example, in this case, the wafer may be moved in 110 μm steps so that the subsequent second patterns 20 are incrementally misaligned by an additional 10 μm in each step (e.g., 10 μm, then 20 μm, then 30 μm, etc.). As a consequence, each second readable element 22 is shifted relative to the first readable element 14 by the increment. This shifting or misalignment allows the second readable element 22 in conjunction with the first readable element 14 to form another variable pattern 24b.

The variable pattern 24b in the second prime die 30 is different from the variable pattern 24a in the first prime die 28. For example, in FIG. 3B, the variable pattern 24b is an arrow (the second readable element 22) pointing to the second of six hatch marks (the first readable element 14). In this example, the variable pattern 24b designates that the prime die 30 is the second die in a row of six prime die. The increment 26 that the second pattern 20 is misaligned from its corresponding first pattern 10 is the same distance as the hatch marks are apart in the first readable element 14. Thus, through the use of a carefully engineered layout and design interaction between the first readable elements 14 and the second readable elements 22, a variable pattern 24 may be formed across the entire wafer 12.

Figure 3B:
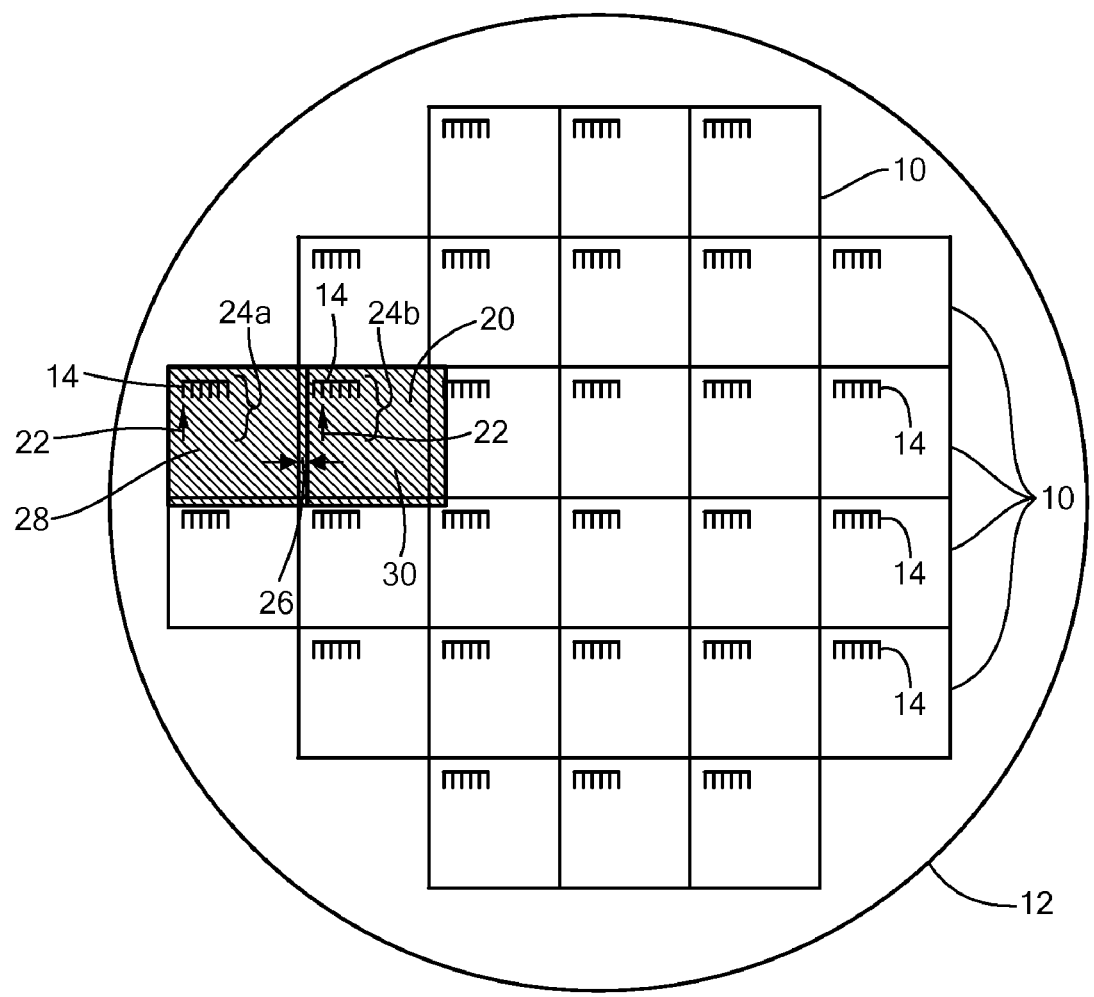
Figure 3C:
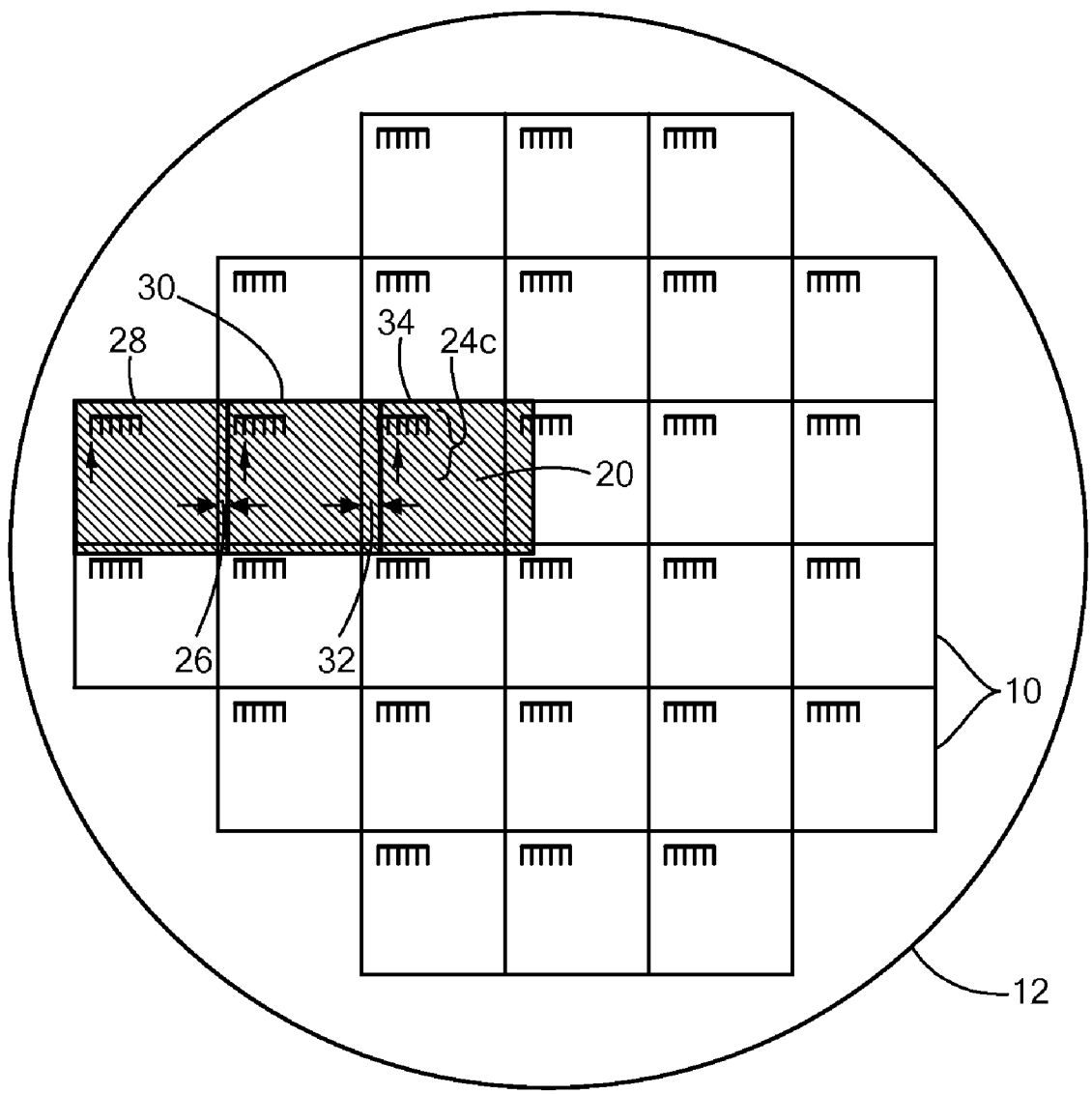
Figure 3D:
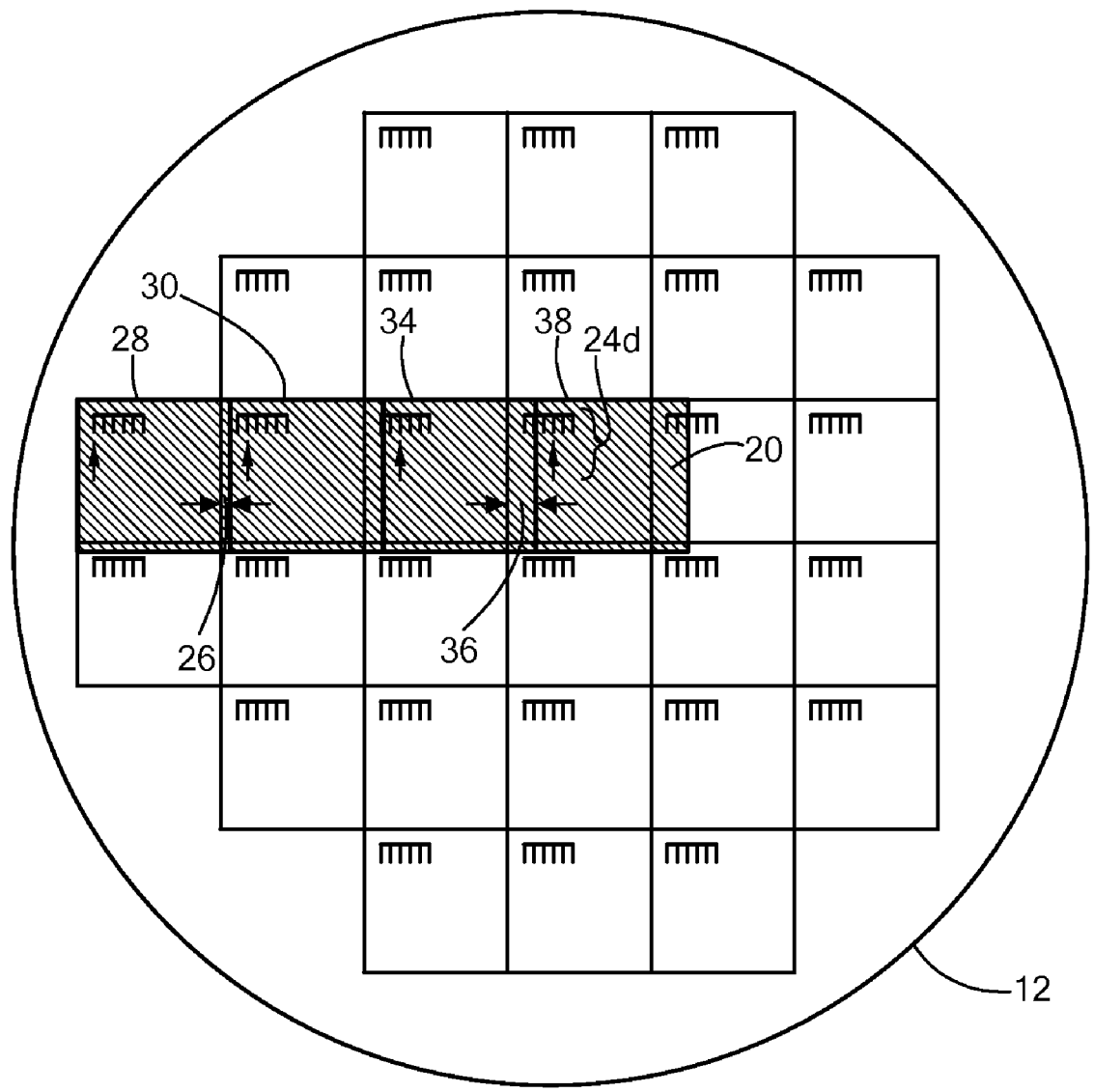
Figure 3E:
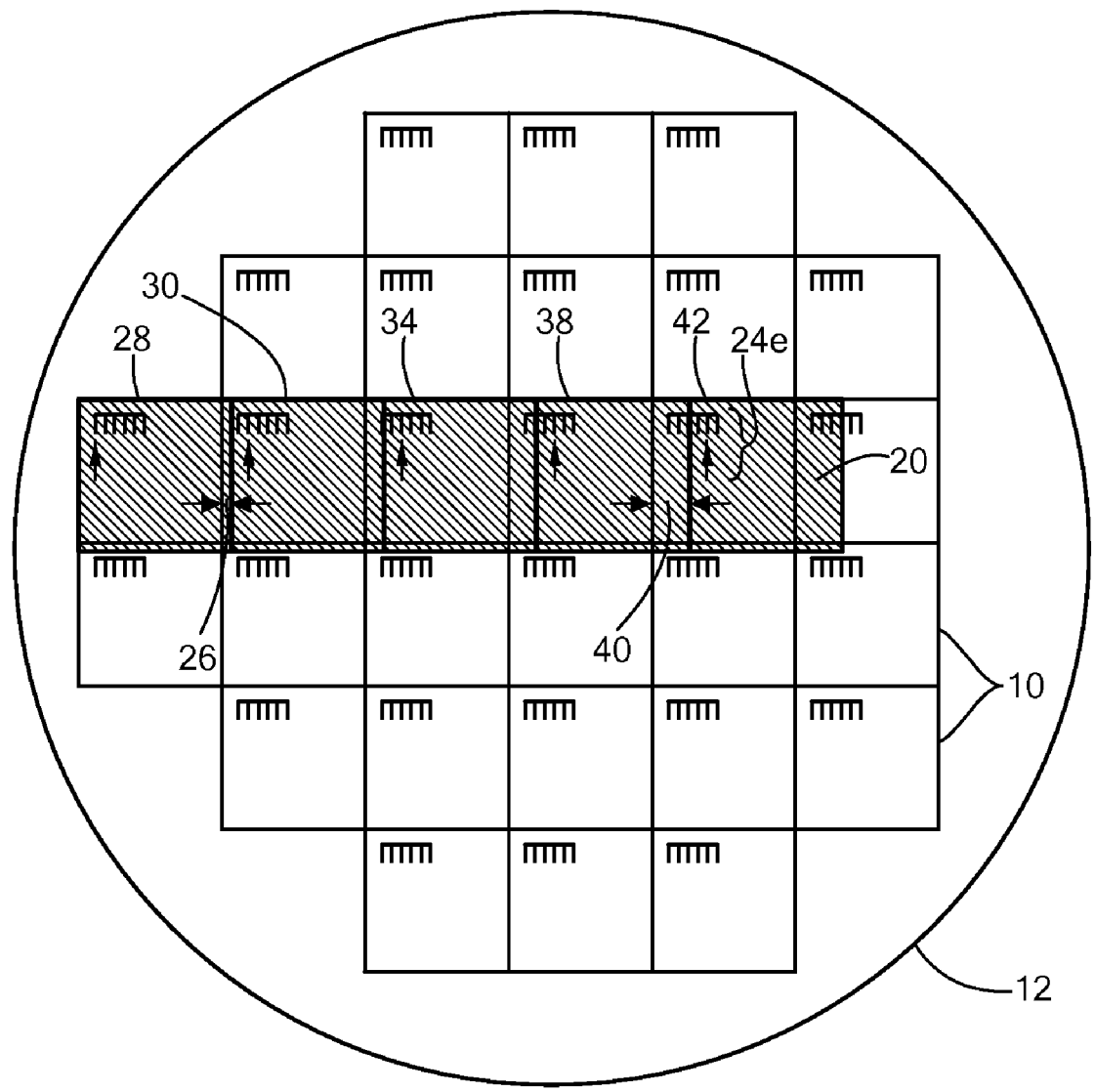
Figure 3F:
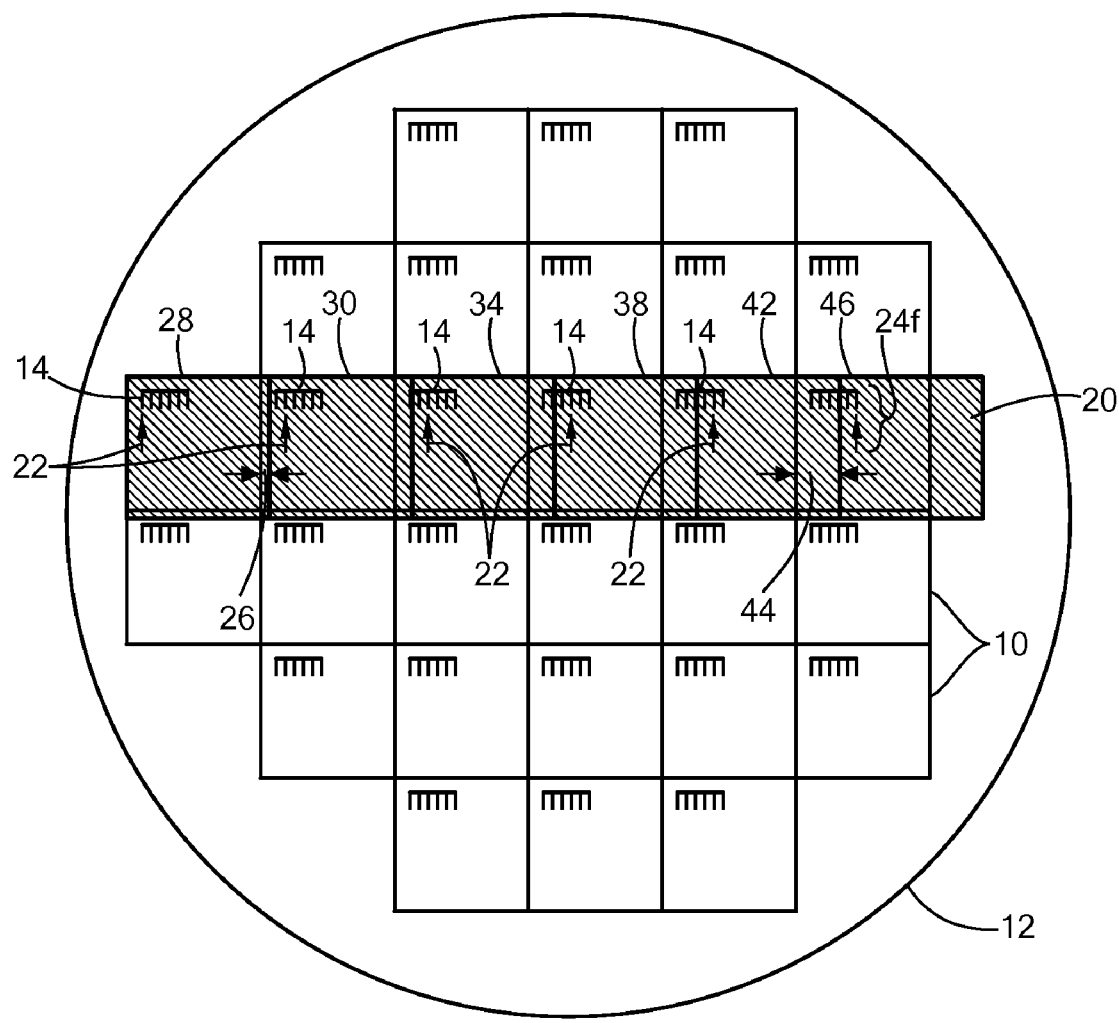

For example, FIGS. 3C through 3F show the incremental misalignment of each subsequent second pattern 20 formed with respect to its corresponding first pattern 10 along one row. Specifically, as shown in FIG. 3C, the third second pattern 20 is misaligned with respect to its corresponding first pattern 10 by a second increment 32 that is twice the length of the first increment 26, thus forming another variable pattern 24c in the third prime die 34. For example, continuing with the example from above, the third second pattern 20 may be formed by moving the wafer 12 over the same 110 μm distance, thus creating a larger 20 μm misalignment with respect to the underlying first pattern 10. Similarly, as shown in FIG. 3D, the fourth second pattern 20 may be formed by moving the wafer 12 over the same distance, which misaligns it with respect to its corresponding first pattern 10 by a third increment 36 that is three times the length of the first increment 26, forming variable pattern 24d in the fourth prime die 38. FIG. 3E shows the fifth second pattern 20 misaligned with respect to its corresponding first pattern 10 by a fourth increment 40 that is four times the length of the first increment 26, forming variable pattern 24e in the fifth prime die 42 and FIG. 3F shows the sixth second pattern 20 misaligned with respect to its corresponding first pattern 10 by a fifth increment 44 that is five times the length of the first increment 26, forming variable pattern 24f in the sixth prime die 46.

Figure 4:
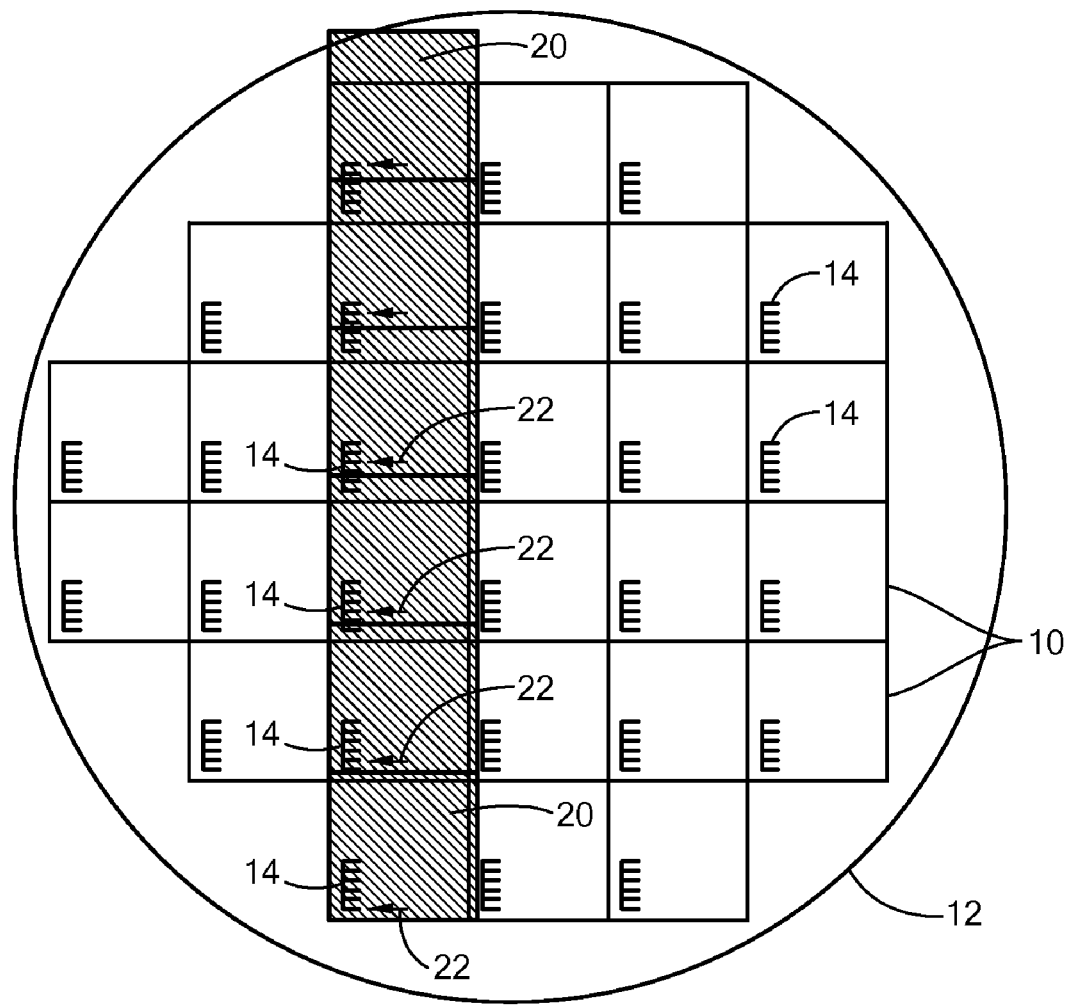
FIG. 4 schematically shows a second repeating pattern varying across the wafer in a column relative to the first repeating pattern according to illustrative embodiments of the present invention.

As mentioned above, discussion of specific dimensions is illustrative and not intended to limit various aspects of the present invention. In addition, although FIGS. 3A through 3F show the variable pattern 24 formed across the wafer 12 in a row, similar methods may also be used to form the variable pattern 24 across the wafer 12 in a column, such as shown in FIG. 4. For example, in FIG. 4, the first readable element 14 is formed with six hatch marks in a vertical orientation and the second readable element 22 is a horizontal arrow pointing to the various hatch marks of the first readable element, together forming the variable pattern 24. In this way, each prime die on the wafer 12 may be formed with a variable pattern 24 that is unique to that particular die.

In FIGS. 3A through 3F, the second pattern 20 is shown formed with a larger reticle field image, and thus area, than the first pattern 10. For example, the second pattern 20 may have a longer width dimension in the x-direction, a longer length dimension in the y-direction, or both. However, the second pattern 20 may also be formed with a smaller reticle field image, so that the wafer 12 is moved a distance that is less than the first pattern 10, still causing an incremental misalignment.

Although the figures show the second pattern 20 having a larger area than the first pattern 10, the second pattern may also have the same area as the first pattern 10. In this case, after the initial alignment, the wafer 12 may just be moved a distance that is an increment larger or smaller than the first pattern's 10 size in one dimension. For example, if the first pattern 10 and the second pattern 20 are 100 μm×100 μm in size, then the wafer 12 may be moved 110 μm in width or length (if using a 10 μm increment misalignment after the initial alignment of the first second pattern 20 with the first first pattern 10) to misalign the second second pattern 20 with respect to the second first pattern 10. The wafer 12 may then be moved in 110 μm steps so that the subsequent second patterns 20 continue to be incrementally misaligned by an additional 10 μm in each step. Thus, carefully engineered misalignment or mismatch in pattern placement and/or stepping distance at one or more photolithographic steps may allow a variable pattern 24 to be formed across the wafer 12.

Figure 5A:
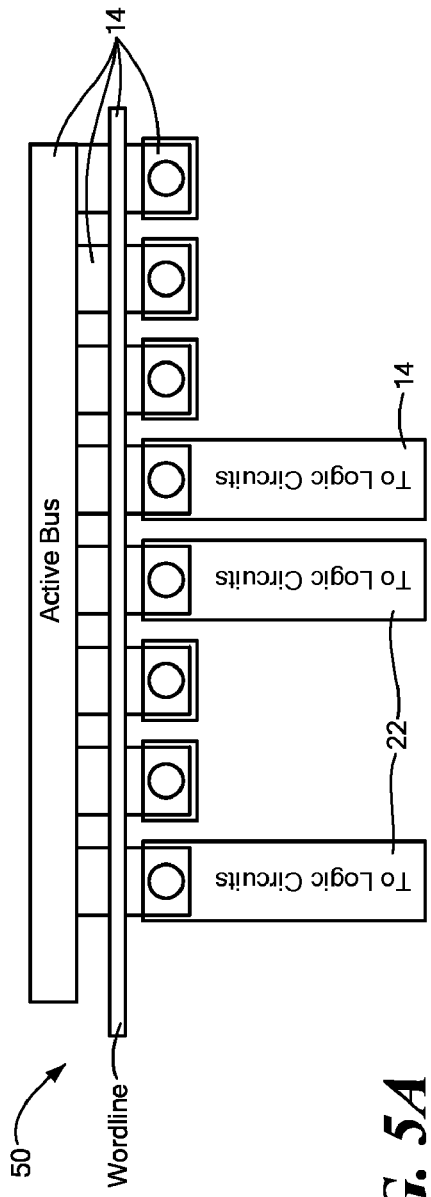
FIG. 5A schematically shows a basic read-only memory device that may be formed with illustrative embodiments of the present invention.

The variable pattern 24 may be used to form one or more patterns (e.g., physical indicia) and/or one or more electrical components (e.g., read-only memory, capacitors, diodes, resistors, transistors, etc.) that may be optically and/or electrically readable. For example, FIG. 5A schematically shows a basic read-only memory (ROM) structure that may be formed as the variable pattern 24. As shown, such memory may have an active bus and a wordline with eight fuses for forming metallized connections. External circuitry may interpret the pattern of these metallized connections to determine the readable element.

For example, as shown in FIG. 5A, the first pattern 10 may include first readable elements 14 (e.g., active bus and contacts along the transistor bank) that may form part of the ROM device 50 in one or more layers on the wafer 12. The second pattern 20 may include second readable elements 22 (e.g., contacts or metal interconnects providing the logic states to read in the device) that form another part of the ROM device 50 in one or more layers on the wafer 12. Thus, the first readable elements 14 and the second readable elements 22 together form the ROM device 50. The ROM device 50 may provide optically and/or electrically readable information.

Figure 5B:
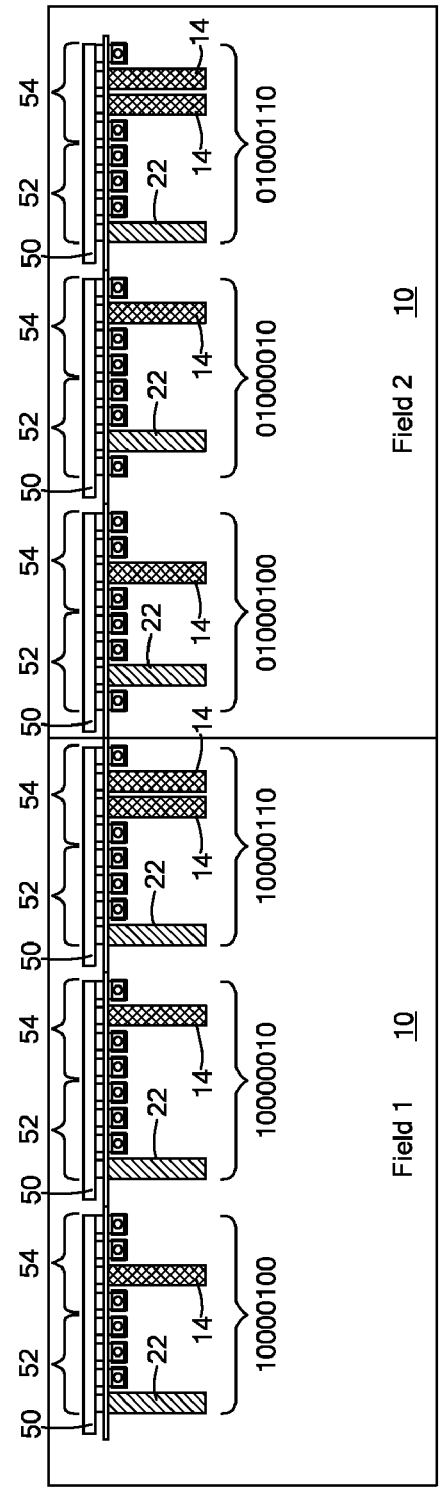
FIG. 5B schematically shows basic read-only memory devices that may be formed with illustrative embodiments of the present invention.

To further illustrate, FIG. 5B schematically shows one implementation of how various ROM devices 50 may form the variable pattern 24 in embodiments of the present invention. As shown, Field 1 shows one portion of a first pattern 10 showing three ROM devices 50 and Field 2 shows one portion of another first pattern 10 showing three ROM devices 50. The ROM devices 50 may include an area 52 (e.g., the first four contacts or fuses) that is used as an expansion ROM programming area to determine the prime die location within the wafer 12. The ROM devices 50 may also include an area 54 (e.g., the last four contacts or fuses) which is used or programmed at the time of device layout which designates the intra-die or device location within the prime die or first pattern 10.

For example, in Fields 1 and 2, the first readable element 14 includes the area 54 in the leftmost ROM device 50 which has a metal interconnect in the second of the four contacts, the middle ROM device 50 includes a metal interconnect in the third of the four contacts, and the rightmost ROM device 50 includes metal interconnects in the second and third of the four contacts. These first readable elements 14 may designate the intra-die or ROM device location within the prime die or first pattern 10. In this example, the 0100 position is the leftmost ROM device 50 position, the 0010 position is the middle ROM device 50 position, and the 0110 position is the rightmost ROM device 50 position. The second readable element 22 may then be formed to designate the prime die location within the wafer 12. For example, in Field 1, the second readable element 22 in all three ROM devices 50 includes a metal interconnect formed in the first contact in area 52. Conventional fabrication techniques may form the metal connections on these contacts in a separate process, or in the same process.

In illustrative embodiments, the contacts are separated by a distance that is substantially equal to the above noted increment 26 or offset difference between the first pattern 10 and the second pattern 20. For example, using the illustrative numbers above, the contacts may be 10 µm apart. Thus, when the second pattern 20 is stepped over or incrementally misaligned with respect to the first pattern 10, the second readable element 22 in all three ROM devices 50 in Field 2 includes a metal interconnect formed in the second contact in area 52. In this example, the 1000 position designates Field 1 and 0100 position designates Field 2, which relates to the first pattern 10 or prime die location within the wafer 12. In this manner, the various ROM devices within each field, e.g., Field 1 and 2, form the variable pattern 24 that provides electrically and optically readable elements and may provide unique circuitry across the wafer 12.

Figure 6A:
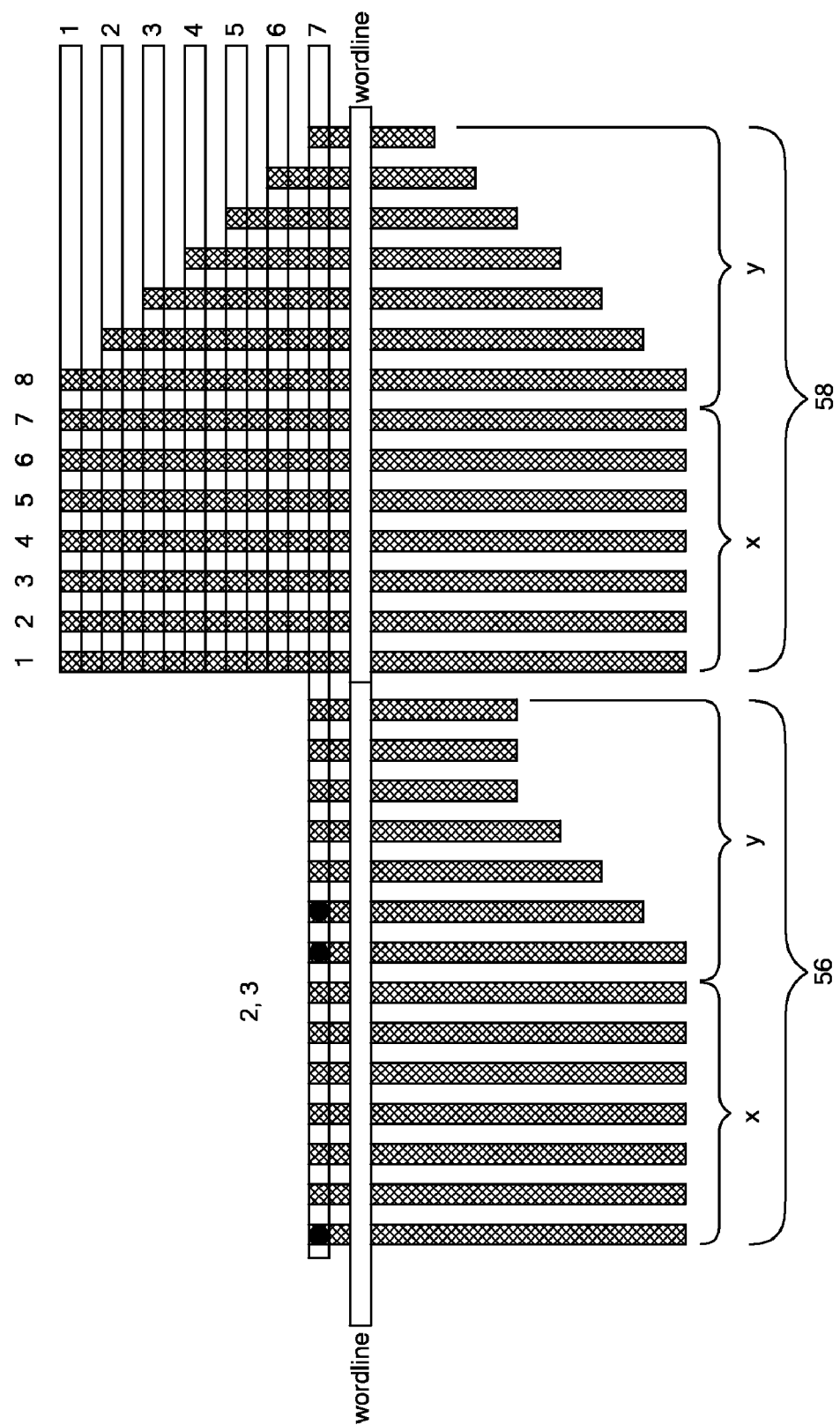
FIGS. 6A-6F schematically show another read-only memory design that may be used with illustrative embodiments of the invention.
Figure 6B:
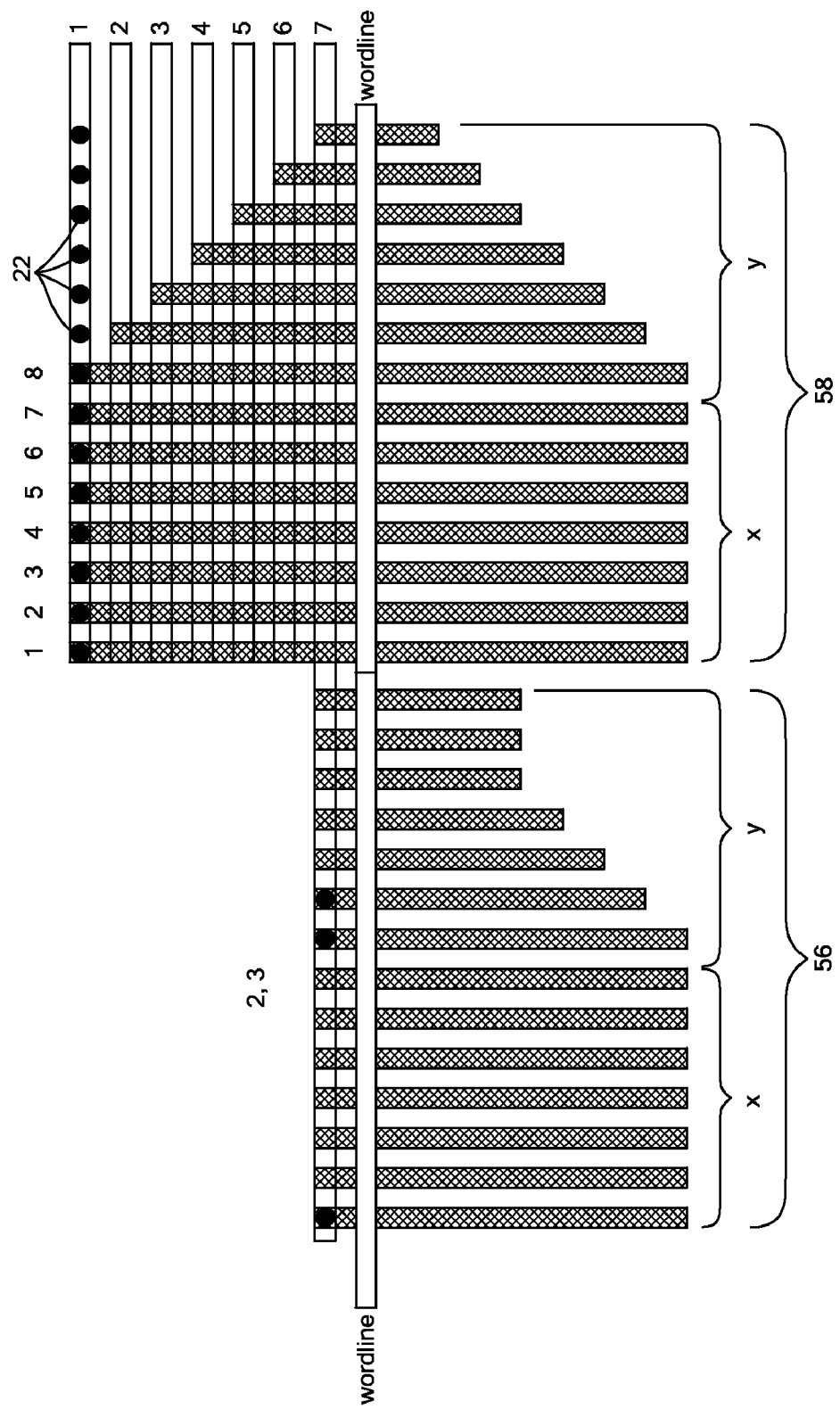
Figure 6C:
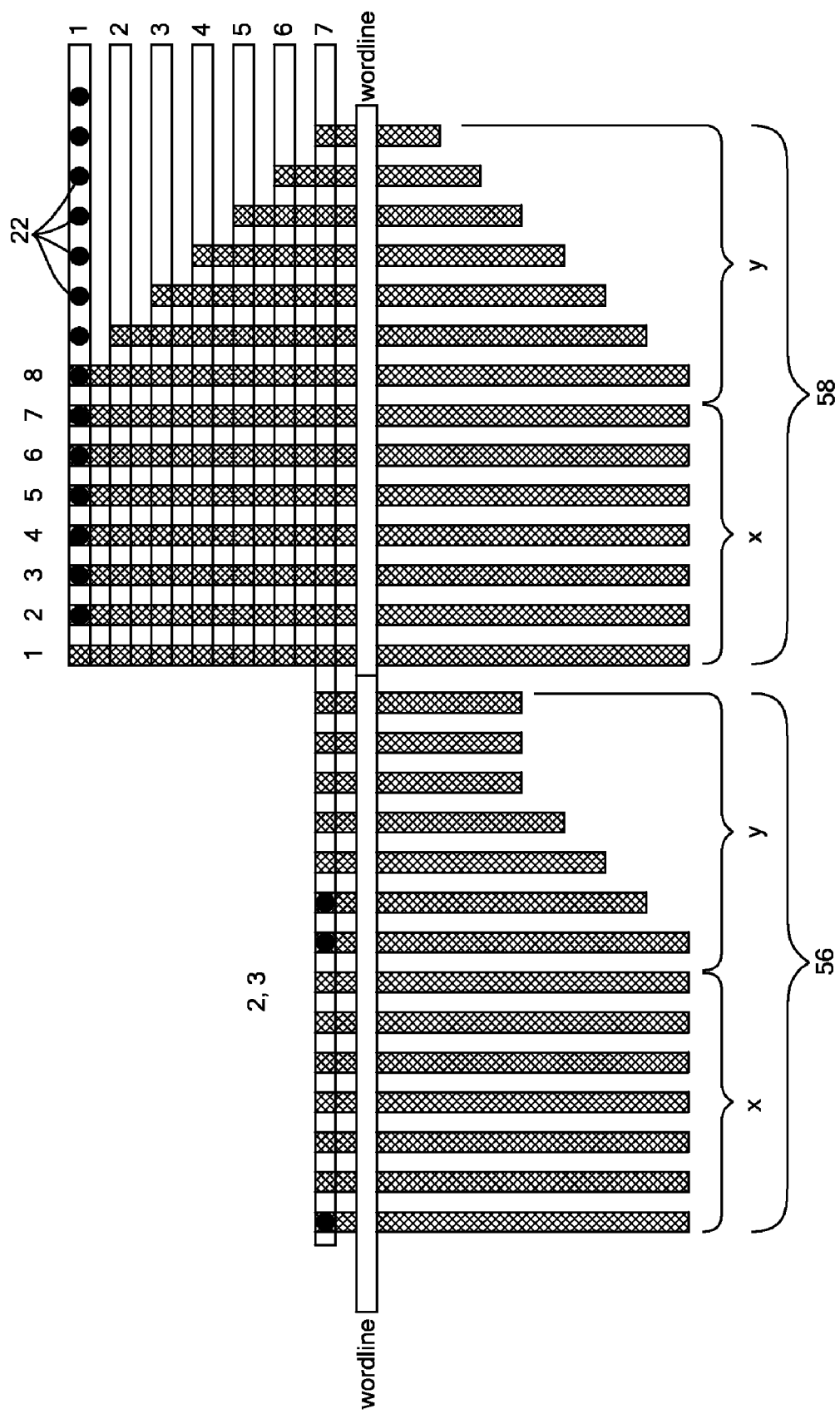
Figure 6D:
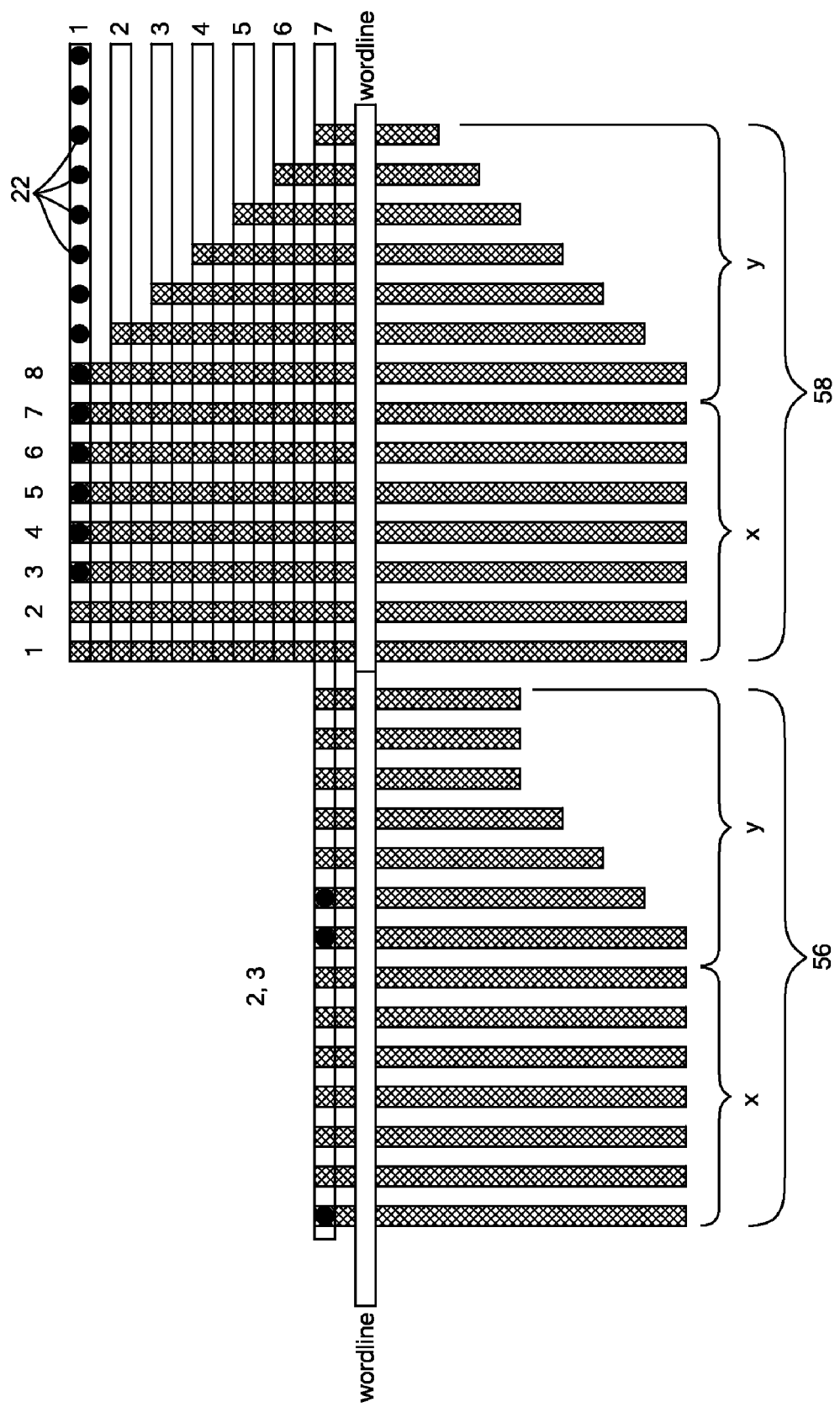
Figure 6E:
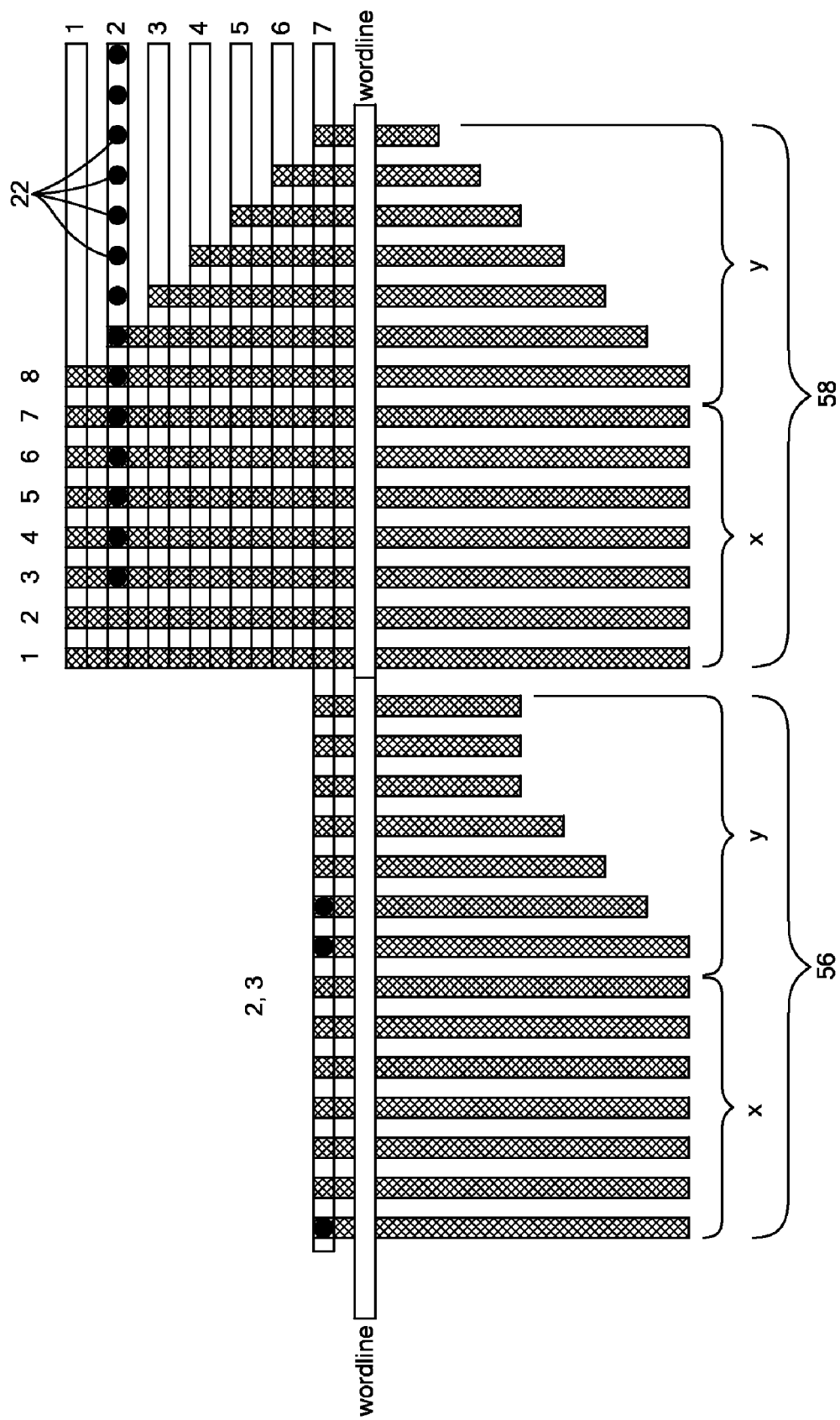
Figure 6F:
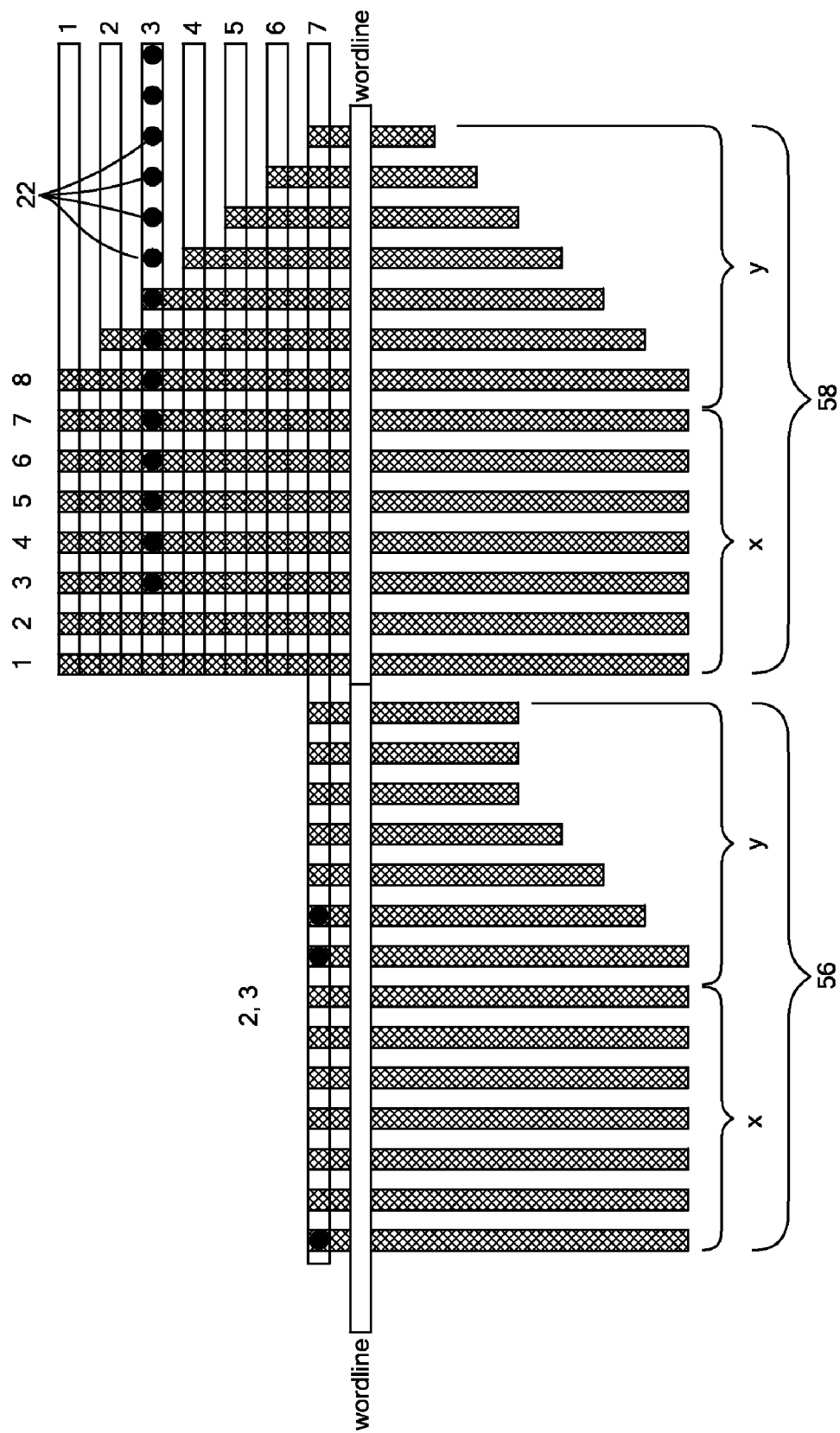

Some embodiments may provide one or more patterns and one or more electrical components or devices. For example, FIGS. 6A through 6F schematically show another embodiment that uses a ROM design in conjunction with additional metallized connections to show positional information in both the horizontal and vertical directions. For example, FIG. 6A shows a first readable element 14 pattern. Area 56 designates the intra-die coordinate information within a first pattern 10 and area 58 will contain the second readable element 22 that, in conjunction with the first readable element 14, specifies the prime die location in the wafer 12. For example, in FIG. 6B, the second readable element 22 may include a series of contacts, such as may be shown when the prime die location is the same as shown in FIG. 3A. Similarly, FIG. 6C shows the second readable element 22 when the second pattern 20 is misaligned with respect to the first pattern 10 by one increment in a horizontal direction, such as shown in FIG. 3B. FIG. 6D shows the second readable element 22 when the second pattern 20 is misaligned with respect to the first pattern 10 by a second increment in a horizontal direction, such as shown in FIG. 3C. FIG. 6E shows the second readable element 22 when the second pattern 20 is misaligned with respect to the first pattern 10 by one increment in a vertical direction, e.g., if the second pattern 20 was moved down one pattern from that shown in FIG. 3C. Similarly, 6F shows the second readable element 22 when the second pattern 20 is misaligned with respect to the first pattern 10 by a second increment in a vertical direction, e.g., if the second pattern 20 was moved down two patterns or prime die locations from that shown in FIG. 3C.

Thus, through the use of carefully engineered misalignment pattern placement and/or stepping distance at one or more steps, and a carefully engineered layout and design interaction with the pattern placement mismatches, illustrative embodiments may produce variable patterns 24 across the wafer 12. Such embodiments may allow unique circuitry and/or patterns to be formed on each die, permitting optically and/or electrically readable elements. When the variable pattern 24 includes positional identification information, the readable information may reduce test time and improve yield and quality enhancement through die level traceability. Moreover, various embodiments may be implemented at a relatively low cost. Among other things, those skilled in the art may use standard photolithography and semiconductor processing techniques with minimal additional processing.

The first pattern 10 and/or the second pattern 20 may be formed in one or more layers on the wafer 12, in the same or different processing steps. For example, the first pattern 10 may be formed in a number of different layers of the ultimately formed dies, such as on a contact layer. Some embodiments subject all dies on a wafer 12 to these processes. Alternative embodiments, however, subject only a subset of the dies to these processes.

Although the above discussion discloses various exemplary embodiments of the invention, it should be apparent that those skilled in the art can make various modifications that will achieve some of the advantages of the invention without departing from the true scope of the invention.

What is claimed is:

1. A method of forming a variable pattern across a wafer using a reticle, the method comprising:
    forming a plurality of first patterns on the wafer, each of the first patterns having a first readable element; and
    forming a plurality of second patterns on the wafer, each of the second patterns having a second readable element, wherein the second patterns are positioned relative to the first patterns by
        aligning one of the second patterns relative to one portion of one of the first patterns, and
        incrementally misaligning each successive second pattern in a row or a column relative to each successive first pattern, such that each corresponding first readable element and second readable element form the variable pattern.

2. The method of claim 1, wherein the first pattern and the second pattern are formed by two different reticles.

3. The method of claim 1, wherein the first pattern and the second pattern are formed by two patterns on one reticle.

4. The method of claim 1, wherein each of the first patterns has a length, and incrementally misaligning each successive second pattern includes moving the wafer a distance greater than or less than the length of the first pattern.

5. The method of claim 1, wherein each of the first patterns has a width, and incrementally misaligning each successive second pattern includes moving the wafer a distance greater than or less than the width of the first pattern.

6. The method of claim 1, wherein each of the first patterns has an area and each of the second patterns has a larger or smaller area than the first pattern, so that incrementally misaligning each successive second pattern includes forming the larger or smaller area of the second pattern.

7. The method of claim 1, wherein the variable pattern is optically readable.

8. The method of claim 1, wherein the variable pattern is electrically readable.

9. The method of claim 1, wherein the variable pattern forms one or more patterns that indicate the physical location of die within the first pattern and die in the wafer.

10. The method of claim 1, wherein the variable pattern forms one or more electrical components.

11. A method of patterning a wafer, the method comprising:
   applying a first reticle image to the wafer repeatedly in order to form a first pattern that repeats across the wafer, each of the first patterns having a first readable element;
   applying a second reticle image to the wafer repeatedly in order to form a second pattern that repeats across the wafer, each of the second patterns having a second readable element, one of the second patterns being aligned with respect to a portion of one of the first patterns and subsequent second patterns being offset from subsequent first patterns by a distance that varies across the wafer, the first readable element of one of the first patterns and the second readable element of one of the second patterns forming a variable pattern that varies across the wafer.

12. The method of claim 11, wherein the first reticle image and the second reticle image are formed from one reticle.

13. The method of claim 11, wherein the first reticle image and the second reticle image are formed from two different reticles.

14. The method of claim 11, wherein the variable pattern is optically readable.

15. The method of claim 11, wherein the variable pattern is electrically readable.

16. The method of claim 11, wherein the variable pattern forms one or more patterns that indicate the physical location of die within the first pattern and die in the wafer.

17. The method of claim 11, wherein the variable pattern forms one or more electrical components.

18. The method of claim 17, wherein the electrical components include one or more of resistors, capacitors, diodes, or read-only memory.

19. The method of claim 11 wherein applying the second reticle image comprises varying dimensions of the second reticle image relative to the first reticle image.

20. The method of claim 11, further comprising
   moving the wafer a dimension greater than or less than one dimension of the first repeating pattern in order to offset the subsequent first patterns by the varying distance.

* * * * *